(12) United States Patent
Monfray et al.

(10) Patent No.: US 6,852,993 B2
(45) Date of Patent: Feb. 8, 2005

(54) EMISSION PROCESS FOR A SINGLE PHOTON, CORRESPONDING SEMICONDUCTING DEVICE AND MANUFACTURING PROCESS

(75) Inventors: Stéphane Monfray, Grenoble (FR); Didier Dutartre, Meylan (FR); Frédéric Boeuf, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 95 days.

(21) Appl. No.: 10/429,908

(22) Filed: May 5, 2003

(65) Prior Publication Data

US 2003/0218163 A1 Nov. 27, 2003

(30) Foreign Application Priority Data

May 3, 2002 (FR) .............................................. 02 05539

(51) Int. Cl.[7] ...................... H01L 29/06; H01L 31/072; H01L 31/109
(52) U.S. Cl. ............................. 257/13; 257/14; 257/79; 257/97; 438/142; 438/167; 438/182; 438/962
(58) Field of Search ............................. 257/13, 14, 17, 257/20, 24, 79, 85, 94, 97, 275, 280–283; 438/142, 167, 172, 182, 962

(56) References Cited

U.S. PATENT DOCUMENTS 6,455,872 B1 * 9/2002 Williams et al. ............... 257/14
6,627,914 B1 * 9/2003 Komiyama et al. ............ 257/29
6,720,589 B1 * 4/2004 Shields ........................ 257/194
6,728,281 B1 * 4/2004 Santori et al. ................ 372/45

OTHER PUBLICATIONS

Boeuf et al., *16 nm Planar NMOSFET Manufacturable within State-of-the-Art CMOS Process Thanks to Specific Design and Optimisation*, International Electron Devices Meeting, Technical Digest (Cat. No. 01CH37224), International Electron Devices Meeting, Washington, DC, Dec. 2–5, 2001, pp. 29.5.1–3, XP002237153.

Moreau et al., *Single–Mode Solid–State Single Photon Source Based on Isolated Quantum Dots in Pillar Microcavities*, Applied Physics Letters, Oct. 29, 2001, AIP, USA, vol. 79, No. 18, pp. 2865–2867, XP002237154.

* cited by examiner

Primary Examiner—Asok Kumar Sarkar
(74) Attorney, Agent, or Firm—Lisa K. Jorgenson; Allen, Dyer, Doppelt, Milbrath & Gilchrist, P.A.

(57) ABSTRACT

An integrated circuit includes a semiconductor device forming a single photon source, and includes a MOS transistor on a silicon substrate. The MOS transistor has a mushroom shaped gate for outputting a single electron on its drain in a controlled manner in response to a control voltage applied to its gate. The transistor also includes at least one silicon compatible quantum box. The quantum box is electrically coupled to the drain region of the transistor, and is capable of outputting a single photon on reception of a single electron emitted by the transistor.

46 Claims, 8 Drawing Sheets

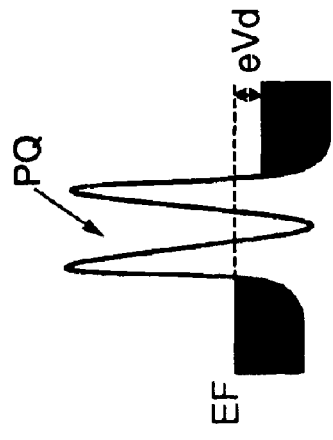
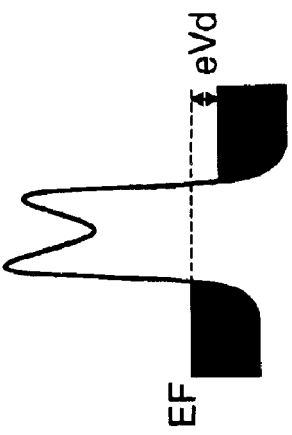
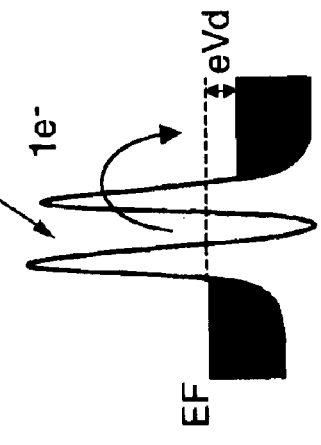
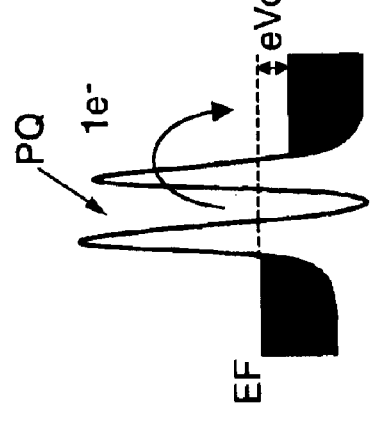
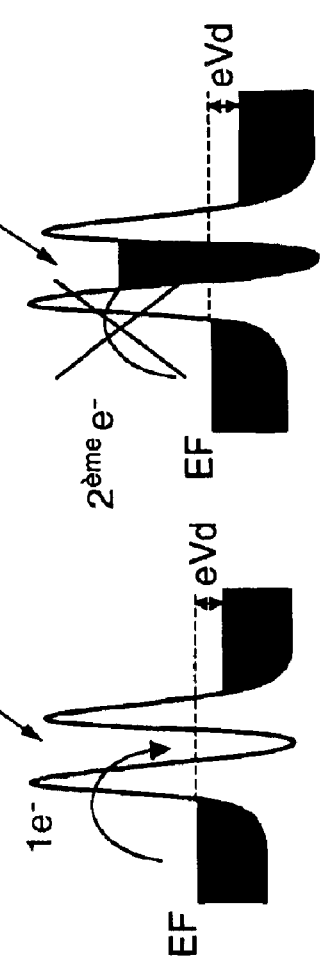

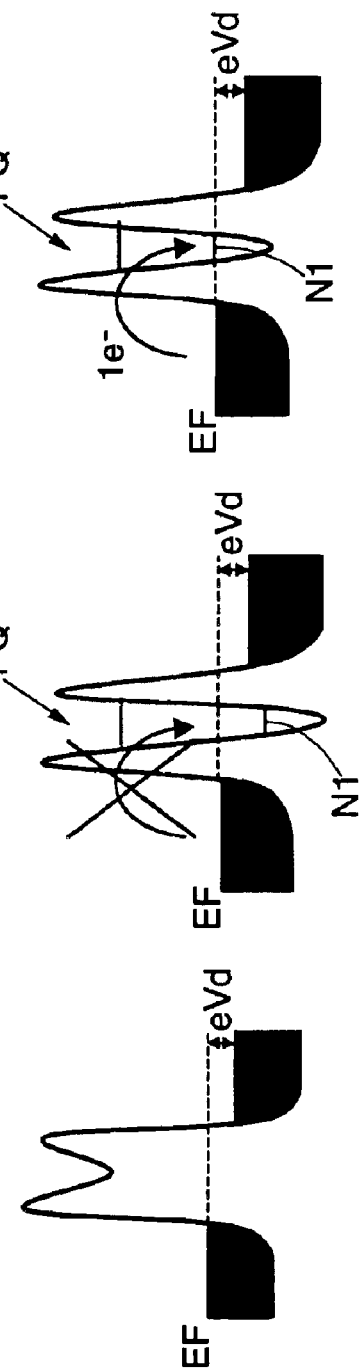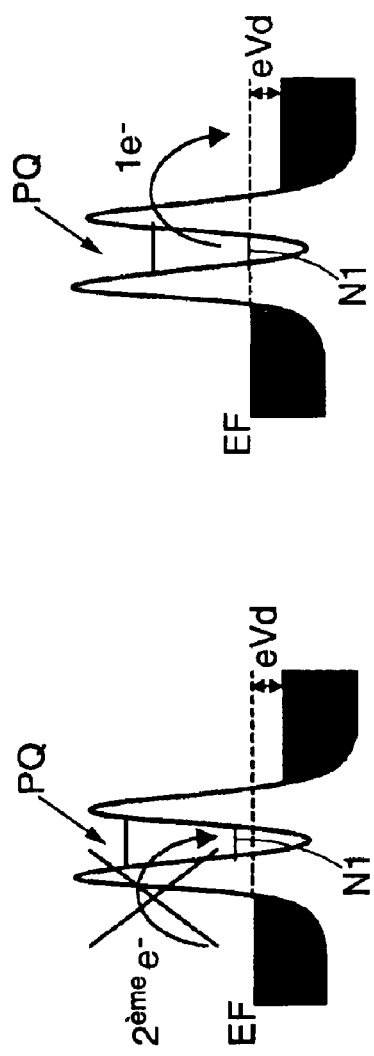

EMISSION PROCESS FOR A SINGLE PHOTON, CORRESPONDING SEMICONDUCTING DEVICE AND MANUFACTURING PROCESS

FIELD OF THE INVENTION

The present invention relates to integrated circuits, and more particularly, to single photon sources. The present invention is advantageously applicable to the field of cryptographic communications, for example.

BACKGROUND OF THE INVENTION

The current problem with cryptographic communications is due to the fact that the message transmitted from point A to point B can be copied in the interval that separates the two points. To overcome this problem, sources are used that emit only a single photon at a time to transmit binary random key type messages. An example of this type of use is described in the article by J. Rarity et al. entitled "Single Photon Sources And Applications", Confined Photon System Fundamental And Applications, Springer Verlag LNP 351, pages 352–365.

However, the remaining problem is to make such a source that emits only one photon at a time. At the present time, there are two major techniques. The first is based on extreme attenuation of a laser source. The second is based on the use of a microcavity type spectral filter on "quantum box" type emitters.

The first approach has the disadvantage that the probability of two photons being emitted instead of one is not negligible. Consequently, this makes it possible to copy these photons since the two photons will have the same polarization.

The second approach, for example, described in the article by E. Moreau et al. entitled "Single-Mode Solid-State Single Photon Source Based On Isolated Quantum Dots In Pillar Microcavities", Applied Physics Letters, Vol. 79, No. 18, pages 2865–2867, requires the use of direct gap materials type II-VI or III-V (a gap is the difference between the conduction band and the valence band), and these materials are extremely difficult to work with.

SUMMARY OF THE INVENTION

In view of the foregoing background, an object of the present invention is to provide an approach to the problem concerning single photon sources, regardless of their applications.

This and other objects, advantages and features in accordance with the present invention are provided a significantly different approach from the prior art; and is based on "all silicon" or more precisely "all silicon compatible material" manufacturing.

In particular, a MOS transistor is used as a single electron source. This electron is then collected by a quantum box that will emit a single photon at the time of recombination of this single electron. The present invention is advantageous in the sense that this single electron is output in a controlled manner by application of a control voltage applied to the transistor gate or grid.

The output of a single electron is the result of either a Coulomb blocking phenomenon, or a resonant tunnel effect phenomenon. A Coulomb blocking effect, resulting in oscillations in the channel of a MOS transistor, was already described in the article by Frédéric Boeuf et al. entitled "16 nm Planar NMOFSET Manufacturable Within State-Of-The-Art CMOS Process Thanks To Specific Design And Optimization", proceedings IEDM 2001, pp. 637. However, the oscillation phenomenon was the result of electrostatic disorders in the structure, and therefore, was not controlled and consequently could not be readily used reproduced.

Therefore, the invention proposes an integrated circuit comprising a semiconductor device forming a single photon source, comprising a MOS transistor with a mushroom or T shaped gate on a silicon substrate, capable of outputting a single electron on its drain in a controlled manner in response to a control voltage applied to its gate.

Furthermore, the semiconductor device forming a single photon source comprises at least one silicon compatible quantum box, electrically coupled to the transistor drain region, and capable of emitting a single photon on reception of a single electron emitted by the transistor.

For purposes of this invention, a "silicon compatible" quantum box refers to a box formed from materials compatible with silicon, for example, silicon and a silicon-germanium alloy.

The mushroom shaped gate of the transistor may be made by a gate bottom with a length L and a width W, above which there is a cap. Side insulating regions (spacers) are adjacent to the sides of the gate. Source and drain regions of the transistor are located in the substrate at a distance from the side edges of the gate bottom.

As a result of such an architecture, a large concentration of carriers is created in the middle of the channel, unlike the channel regions which are not underneath the gate bottom. Applying the control voltage on the transistor gate causes a potential in the channel presenting a camel back shape, which confines carriers in a quantum well. This camel back shape enables the Coulomb blocking effect or the resonant tunnel effect to be obtained in a controlled manner.

The operating temperature of the device, and its size and the applied voltages, are all parameters that can be adjusted to achieve the Coulomb blocking principle or the resonant tunnel effect. A person skilled in the art will be able to adjust these parameters as a function of the intended application.

Consequently, if there is a requirement to operate with gate voltages compatible with voltages normally used in CMOS devices, it is preferable if the width W of the gate bottom is less than a few hundred nanometers, for example, less than 500 nm. A Coulomb blocking phenomenon can be observed at higher values, but this will be due to the electrostatic disorders of the structure. Therefore, it will not be possible to control the operating voltage of the device.

Furthermore, according to one embodiment of the invention, the values of L and W are chosen such that the thermal energy of electrons in the transistor source is less than the electrostatic energy of an electron penetrating into the transistor channel. This is one way of achieving the Coulomb blocking principle. For example, the operating temperature of the device is advantageously chosen to be less than 77° K, and L is preferably chosen to be less than 50 nm.

In the intended applications it is particularly advantageous if the voltage applied on the transistor drain is less than 10 mV. The drain voltage should be sufficiently low so that the gate voltage can enable creation of a double barrier structure (camel back shaped) enabling Coulomb blocking or the resonant tunnel effect.

The integrated circuit may comprise control means for outputting the control voltage. The control voltage has a first response value at which the transistor is blocked. This first value is at least zero so that it is insured that the current will be zero in the blocked state. The control voltage also has a second value in which a quantum well is created in the transistor channel, and a single electron passes from the source to the channel, and then to the drain.

When L is greater than or equal to 10nm and is less than 50 nm, the single electron is output based on the Coulomb blocking phenomenon. In this case, the product of the second value of the control voltage and the charge of an electron is an integer multiple of the electrostatic energy of an electron penetrating into the transistor channel. A second value will preferably be chosen such that the product of this second value and the charge of an electron is equal to the electrostatic energy of an electron penetrating into the transistor channel.

When L is less than 10 nm, Coulomb blocking may be replaced by a resonant tunnel effect. In this case, the second value of the control voltage corresponds to an alignment of the fundamental level of the energy of the device with the Fermi level of the transistor source.

In order to be able to emit successive single electrons, the control means are advantageously capable of successfully outputting the two values of the control voltage at an operating frequency greater than the output frequency of an electron from the channel. This assures that only one electron exits at any one time. As a guide, this type of operating frequency could be between 1 MHz and 1 GHz.

Advantageously, the device according to the invention may comprise several adjacent quantum boxes that can be arranged in the same horizontal plane and/or in adjacent stacked horizontal planes. The probability of a single photon being emitted is thus increased by the recombination of the single electron in one of the quantum boxes.

To achieve better electrical coupling between the drain region of the transistor and the quantum boxes, it is preferable if the substrate comprises an additional implanted region located under each quantum box, with the same type of conductivity as the drain region, and in contact with the drain region. For example, each quantum box may comprise germanium encapsulated in silicon.

The integrated circuit may also comprise a layer of insulating material surrounding the transistor. This layer of insulating material includes an orifice or opening above the quantum boxes and forms an optical waveguide. For some applications, the integrated circuit may be arranged in a refrigerated containment.

Another aspect of the invention is directed to a cryptography device comprising an integrated circuit as defined above.

Another aspect of the invention is directed to a process for sending a single photon. The process comprises application on the mushroom-shaped gate of a MOS transistor of a control voltage for generating a single electron at the transistor drain, and trapping this single electron in a quantum box causing the emission of a single photon.

Another aspect of the invention is directed to a process for manufacturing an integrated circuit comprising a semiconductor device forming a single photon source, in which the following are made in and on a silicon substrate: a MOS transistor with a mushroom shaped gate capable of outputting a single electron on its drain in a controlled manner in response to a control voltage applied to its gate; and at least one silicon compatible quantum box electrically coupled to the drain region of the transistor and capable of outputting a single photon on reception of a single electron emitted by the transistor.

According to one embodiment of the invention, several adjacent quantum boxes may be formed. This requires, for example, selective growth of germanium on the surface of a first predetermined region of the substrate, followed by selective growth of silicon on the germanium.

The manufacture of the transistor comprises formation of a second predetermined region of the substrate on the surface, and a gate body isolated from the surface by a gate oxide. The gate body is then laterally etched to form a gate bottom above which there is a cap. For example, the gate body is a heterogeneous stack comprising a lower layer and an upper layer. The material in the lower layer may be etched selectively with respect to the material in the upper layer.

The material from which the lower layer is made may, for example, be a silicon and germanium alloy, while the material in the upper layer is silicon. Furthermore, the source and drain regions of the transistor are advantageously implanted in the substrate using the gate cap as a hard mask.

BRIEF DESCRIPTION OF THE DRAWINGS

Other advantages and characteristics of the invention will become clear after reading the detailed description of embodiments and methods of use, which are in no way limiting, and the attached drawings in which:

FIGS. 4a to 4f diagrammatically illustrate an operating mode of the device according to the invention using Coulomb blocking;

FIGS. 5a to 5e illustrate another operating mode of the device according to the invention using a resonant tunnel effect;

DETAILED DESCRIPTION OF THE PREFERRED EMBODIMENTS

Figure 1:
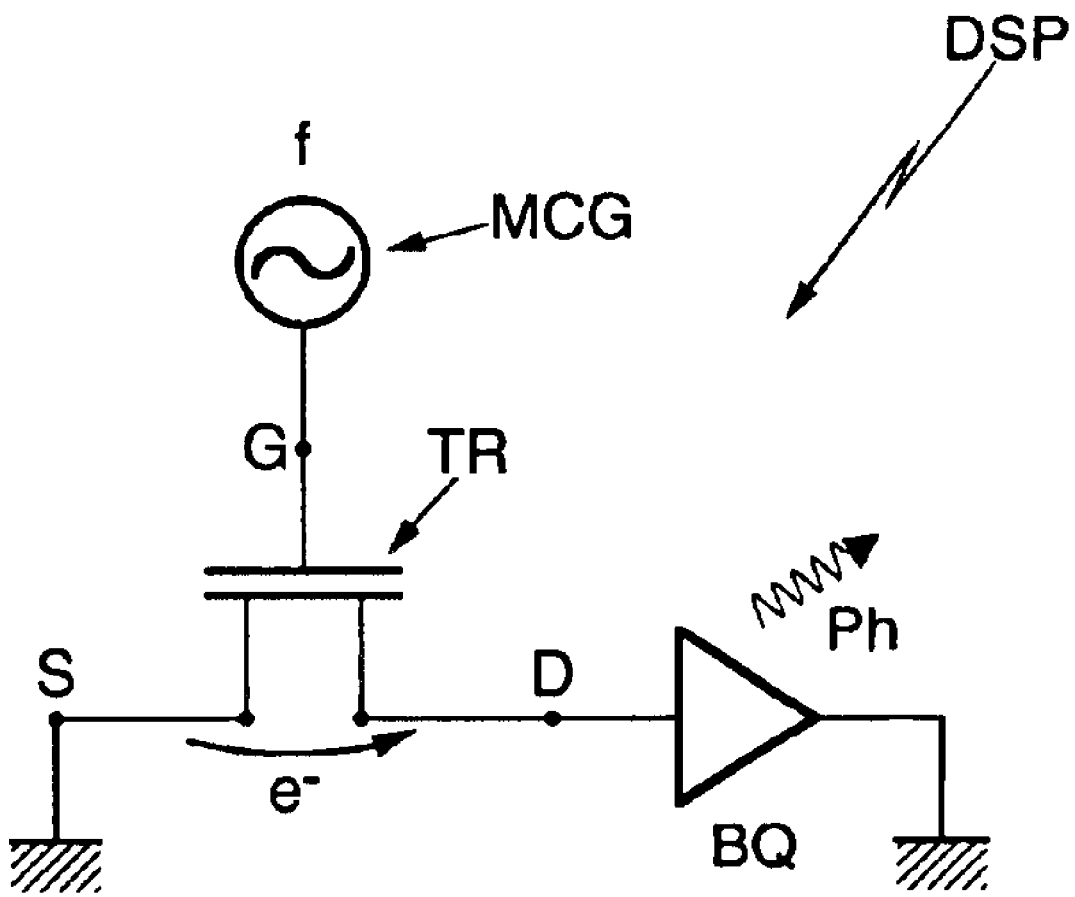
FIG. 1 diagrammatically illustrates an embodiment of a semiconductor device forming a single photon source according to the invention.

In FIG. 1, the DSP reference denotes a semiconductor device forming a single photon source. This device comprises a MOS transistor TR, the source of which is connected to ground, and is capable of outputting a single electron on its drain in response to a control voltage applied to its gate G. The control voltage is output by control means MCG. The control means MCG may also apply a voltage on the drain D.

Figure 2:
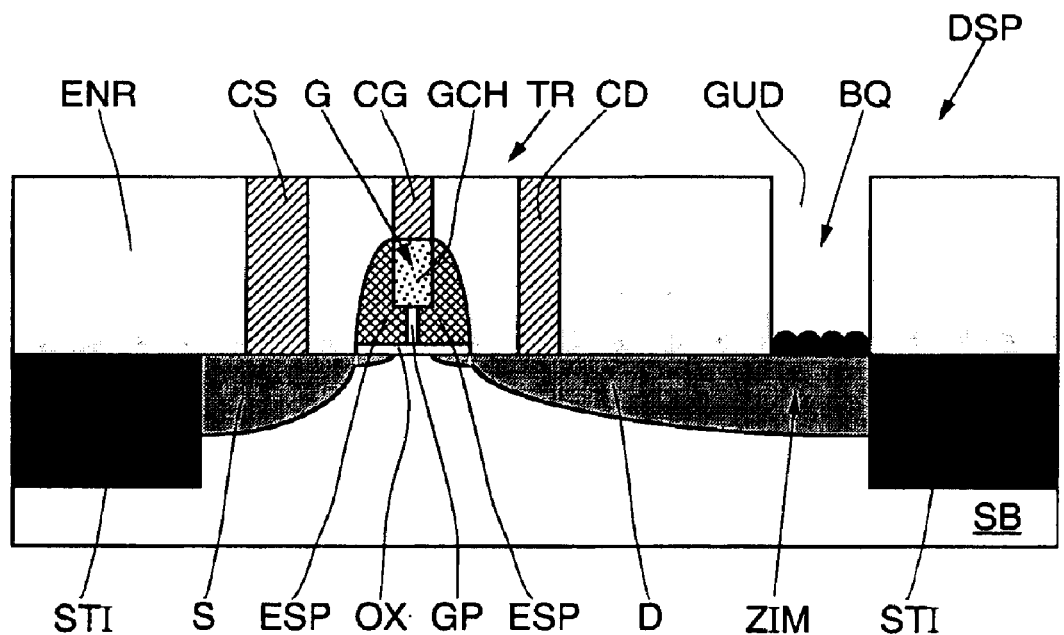
FIG. 2 diagrammatically illustrates a view of the device in FIG. 1 in integrated form.
Figure 3:
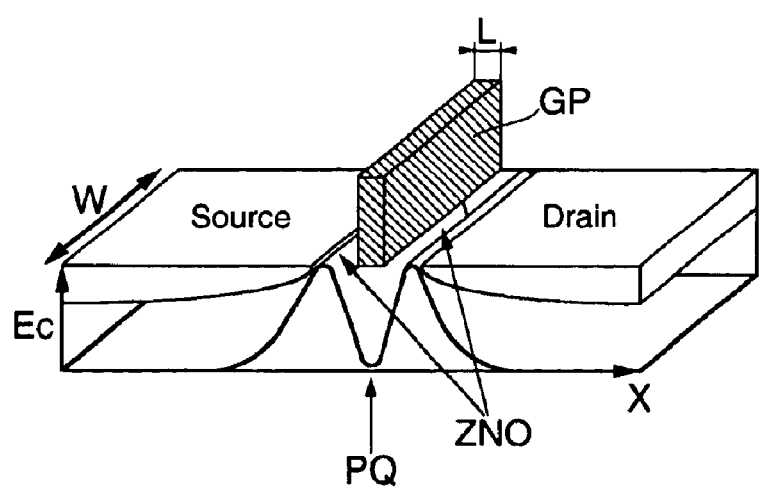
FIG. 3 diagrammatically illustrates a quantum well formed under the gate of a transistor of a device according to the invention.

A quantum box BQ is connected to this drain, and the single electron emitted by the transistor will be trapped in this quantum box and will recombine for generating the emission of a single photon ph. As illustrated in FIGS. 2 and 3, this device DSP is made in integrated form on a semiconductor chip in which the substrate, which is P$^-$ doped for example, is referenced SB.

The transistor TR, for example an NMOS transistor, has a gate G in the shape of a mushroom or a T. More precisely, the gate G of the transistor comprises a gate bottom GP with a length L (the length is a distance measured parallel to the source/drain direction) and a width W (the width W is a dimension measured perpendicular to the length). A cap GCH is provided above the gate bottom GP, which is longer than the gate bottom.

The transistor TR also comprises isolating side regions (spacers) ESP in contact with the sides of the gate, and source and drain regions S and D that are implanted in the substrate at a distance from the side edges of the gate bottom GP. Therefore, the channel region of the transistor comprises areas ZNO that are not covered by the gate bottom GP.

Consequently, the structure in the conducting band and to which a predetermined gate voltage is applied, has a camel back shaped profile (FIG. 3) causing the appearance of a quantum well PQ approximately in the middle of the channel.

The gate G of the transistor TR is isolated from the upper surface of the substrate SB by a gate oxide OX, and is encapsulated in an isolating medium ENR. The device also comprises metallic vias CS, CG and CD respectively forming contact areas on the source, gate and drain regions.

The active area of the substrate SB delimited by isolating regions STI, for example of the shallow trench type, comprises several quantum boxes BQ arranged on the surface of the substrate. Under these quantum boxes BQ, the substrate SB comprises an implanted area ZIM with the same type of conductivity (for example $N^+$) as the drain region D of the transistor, and is in contract with this drain region. Consequently, the quantum boxes BQ are electrically coupled to the drain region of the transistor. The photon emitted by one of these quantum boxes BQ will be directed towards the outside of the device by an optical wave guide GUD formed in an orifice in the surrounding medium ENR that opens out above these quantum boxes BQ.

An operating mode of the device according to the invention will now be described in more detail, particularly with reference to FIGS. 4a to 4f, and more particularly, to an operating mode of the transistor TR based on the Coulomb blocking principle. The Coulomb blocking phenomenon is well known to those skilled in the art, and is based on the use of a sufficiently small capacitance to prevent the entry of a new electron.

Under operating conditions based on the Coulomb blocking principle, the quantum aspect of the channel is neglected. In other words, quantification of the energy is negligible when compared with the electrostatic energy. To achieve the Coulomb blocking principle, the thermal energy of electrons in the transistor source need to be less than the electrostatic energy of an electron penetrating into the transistor channel.

As a first approximation, the electrostatic energy of a transistor penetrating into the channel is defined by the formula (I) below:

$$e^2/(2\epsilon_{Si}\epsilon_0 d) \tag{I}$$

in which e denotes the charge of one electron, $\epsilon_{Si}$ denotes the permittivity of silicon, and d is the diameter of the device that as a first approximation is equal to $(W \times L)^{1/2}$. The thermal energy is equal to $k \times T$, where k denotes Boltzmann's constant and T is the operating temperature of the device.

For operation at a temperature T=300° K, d is approximately equal to 5 nm. A diameter d equal to about 200 nm is necessary for operation at low temperature, in other words, less than 77° K. Values of L and W are respectively equal to approximately 30 nm and 300 nm and are appropriate for operation at a temperature equal to 4.2° K.

In general, a Coulomb blocking phenomenon can be observed if W is very large, for example equal to 1 μm or 10 μm, but this will be due to the electrostatic disorders of the structure. Therefore, it will not be possible to control the output of a single electron. This is why the values of W are preferably less than 500 nm.

FIGS. 4a to 4f show the energy profile in the transistor channel. $E_F$ denotes the Fermi level of the source and Vd denotes the voltage applied to the transistor drain. In FIG. 4a, the voltage Vd applied to the transistor gate is zero. No potential well is created. The operating temperature of the device is chosen such that the value of the thermal energy of electrons is very much lower than the height of the potential barrier thus defined. Consequently, no electrons pass and the transistor is blocked.

In FIG. 4b, the gate voltage becomes positive. The potential well starts to be created, but the minimum energy remains well below the Fermi level of the source. No current passes. When the gate voltage reaches a second value equal to Vg0, the quantum well PQ is below or is at the same value as the Fermi level of the source, and an electron can enter the channel (FIGS. 4c and 4d)

In this respect, the drain voltage must be sufficiently small so that the gate voltage can enable creation of a double barrier type of structure enabling Coulomb blocking. Typically in this case, a drain voltage of less than 10 mV will be chosen. The minimum gate voltage to be applied to reach the conducting state of the transistor is the threshold voltage of this transistor determined conventionally by the thickness of the gate oxide OX, doping of the channel and the output of the material used as the gate electrode. The product of this gate voltage Vg0 by the charge e of an electron should be equal to the electrostatic energy of this electron penetrating into the transistor channel.

Once the electron has penetrated into the transistor channel (FIG. 4e), the transistor modifies the energy of the channel by a value equal to its electrostatic energy. Consequently, the transistor maintains its entire capacity, preventing a second electron from entering into the channel.

Moreover, as illustrated in FIG. 4f, the electron that penetrates into the channel passes into the drain D by the tunnel effect, causing the creation of a drain current. This electron will then be trapped in one of the quantum boxes BQ and will cause a single photon ph to be emitted.

Whenever the product of the charge of an electron and the value of the gate voltage takes on a multiple value of the electrostatic energy, an electron can enter the channel and the transistor is unblocked. Outside these values, the transistor is blocked. Although it would be possible to work around any of these multiple values, the gate voltage is preferably varied between the value 0 and a value such that the product of this value and the electron charge would be equal to the electrostatic energy.

Control means are then capable of successively outputting the two values of the control voltage at an operating frequency that is greater than the electron output frequency from the channel, such as between 1 MHz and 1 GHz, for example. This assures that only one electron is released at any one time.

Figure 6:
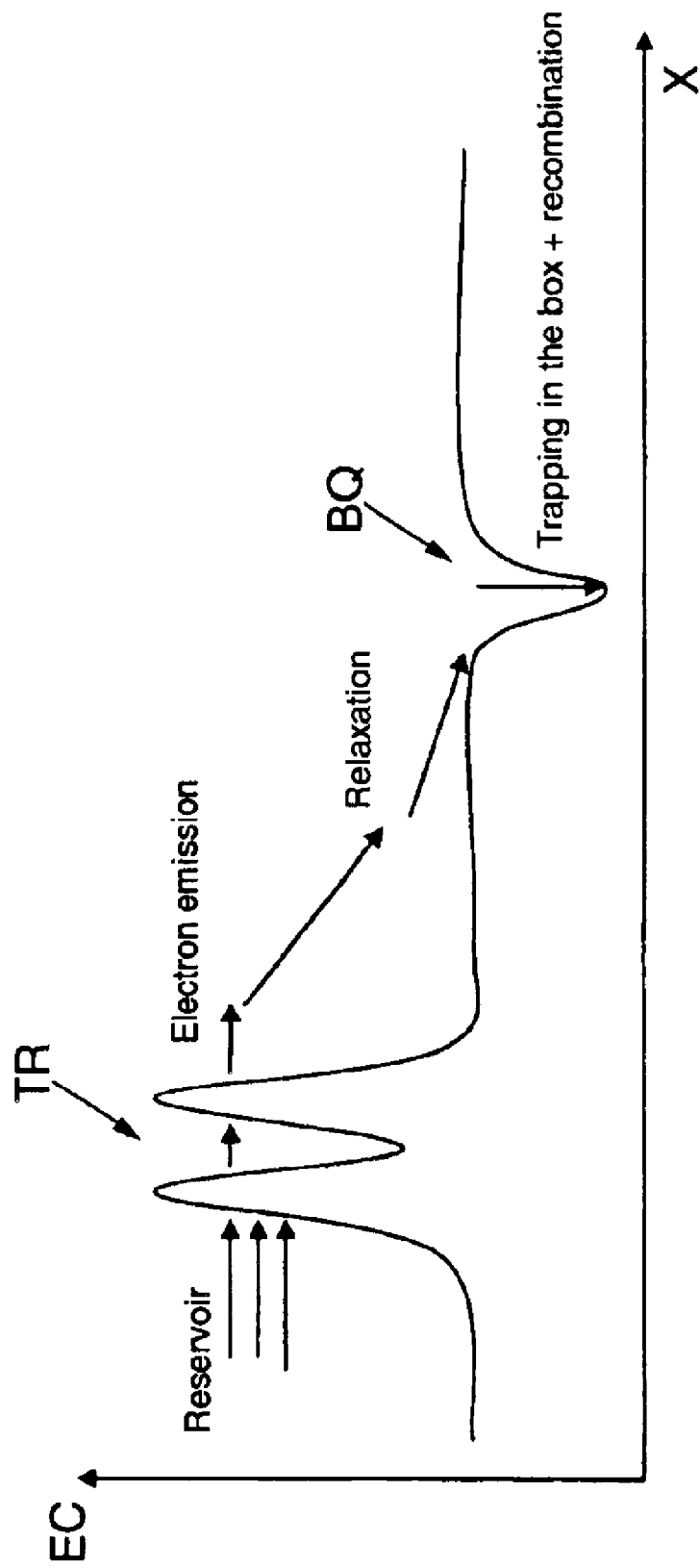
FIG. 6 illustrates a profile of the conducting band of a device according to the invention.

The profile of the structure in the conducting band as shown in FIG. 6 illustrates operation of the device according to the invention. If the conversion efficiency of the quantum boxes is equal to 1, the data flow transmitted by such a device would be equal to the operating frequency f. In this case, the conversion efficiencies in a system using non-direct gap materials are usually very low. But this is not a disadvantage in cryptography applications since the quantity of information to be transmitted by quantum cryptography may be relatively small. Typically, a coding key is coded on 128 bits.

For example, for an operating frequency of 1 MHz and a conversion efficiency equal to $10^{-7}$, the number of bits transmitted per second is equal to 0.1 so that about 20 minutes would be necessary to transmit a 128-bit key. However, it can be demonstrated that with photonic crystals, the quantum efficiency of silicon based boxes could be increased to $10^{-3}$, which would mean that the transmission time for a 128-bit key would be reduced to 0.1 seconds.

When the length L of the gate bottom is particularly small, typically less than 10 mm, Coulomb blocking may be replaced by a resonant tunnel effect. This leads to the same result, but the conditions for determination of blocked and conducting states of the transistor are different. FIGS. 5a to 5e illustrate an example operation based on the resonant tunnel effect.

Under these conditions, the energy of quantified levels is greater than the electrostatic energy. The condition for an electron to pass from the source to the drain is determined first by the alignment of the fundamental level N1 of the quantum well with the Fermi level EF of the source and the electrostatic energy supplied by the electron in the channel. More precisely, as illustrated in FIG. 5a, application of the gate control voltage enables creation of a quantum well.

When the gate voltage increases, the well becomes deeper (FIG. 5b) and quantum energy levels appear. However, if the fundamental level N1 is not aligned with the Fermi level EF of the source, the electron cannot enter the channel. On the other hand (FIG. 5c) if the fundamental level N1 is aligned with the Fermi level, the electron enters the channel. The electrostatic energy provided then offsets the fundamental level, thus preventing another electron from entering the channel (FIG. 5d). The electron that is in the channel can exit by the tunnel effect, bringing the system back into an initial state (FIG. 5e).

Determination of the blocking condition makes it necessary to know the value of the energy of the fundamental level N1. This type of calculation is well known by a person skilled in the art, and in particular, depends on the shape of the gate. In other words, the length L of the gate bottom and the non-overlap of the extension areas with the gate, and the profile of the source/channel and channel/drain junctions.

The following articles showed one example embodiment of quantum boxes: by Boucaud, entitled "Optical Recombination From Excited States In Ge/Si Self-Assembled Quantum Dots", Physical Review B, Volume 64, 155310; and by T. Brunhes et al., entitled "Electroluminescence Of Ge/Si Self-Assembled Quantum Dots Grown By Chemical Vapor Deposition" (Applied Physics Letters, Volume 77, No. 12, Sep. 18, 2000).

Figure 7A:
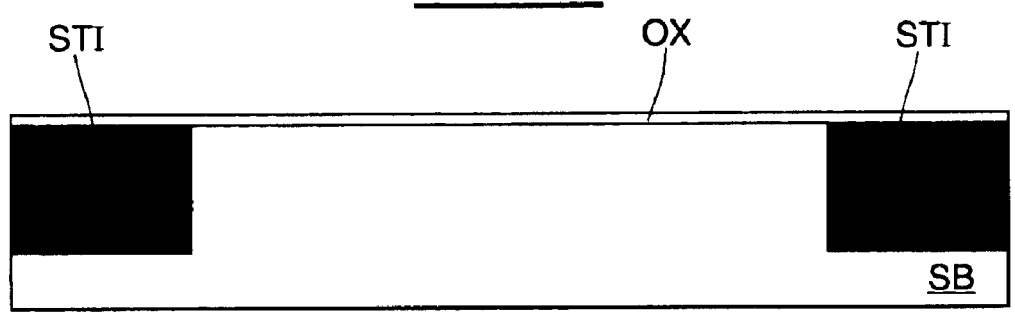
FIGS. 7a to 7i diagrammatically illustrate the main steps of an embodiment of a manufacturing process according to the invention.

Another example embodiment will now be described with reference to FIGS. 7a to 7i that show an embodiment of a process for manufacturing a device according to the invention. In FIG. 7a, reference SB denotes the silicon substrate, for example $P^-$ doped, within which an active area is delimited in a conventional manner, such as by shallow trench isolating STI regions, for example. A thermal oxide OX is then grown on the surface of the substrate.

Figure 7B:
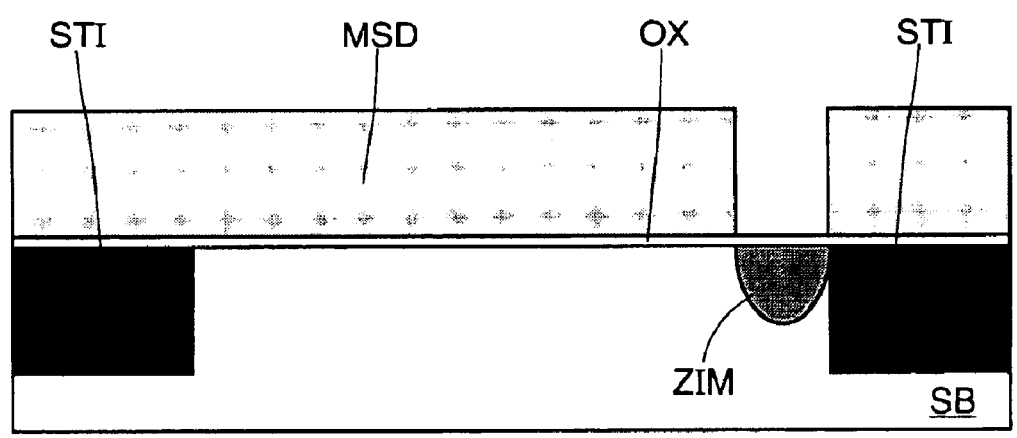
Figure 7C:
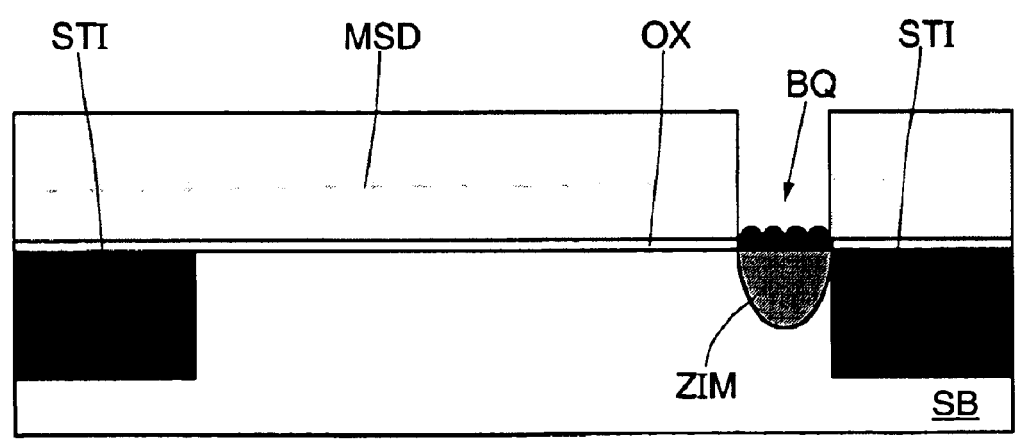
Figure 7D:
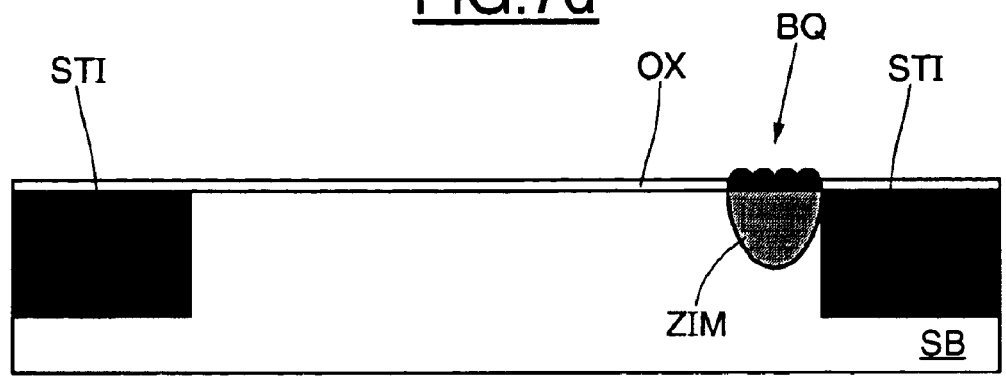

The location of future quantum boxes is then defined using a hard mask, for example made from a layer of silicon nitride. The next step is to implant an area ZIM at the location of the future quantum boxes, which will have the same type of conductivity as the transistor drain zone (FIG. 7b).

Deoxidation is then performed above the area ZIM (FIG. 7c), followed by selective growth of germanium followed by selective growth of silicon. Growth of germanium is translated by the formation of hemispherical droplets, each of which forms a quantum box BQ.

The next step (FIG. 7d) is then implantation followed by selective shrinkage of the hard mask. The next steps include making the transistor with its mushroom shaped gate. A person skilled in the art can refer to French Patent Application No. 2,791,177 which describes such an embodiment, for further information about this subject.

Figure 7E:
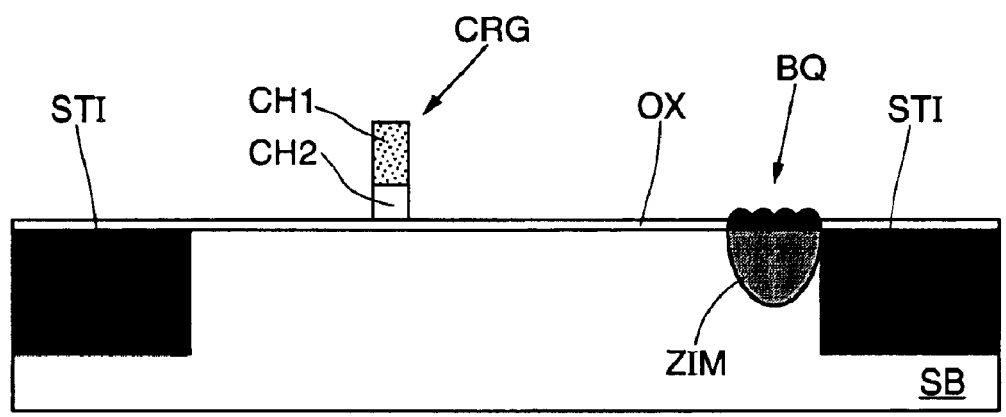
Figure 7F:
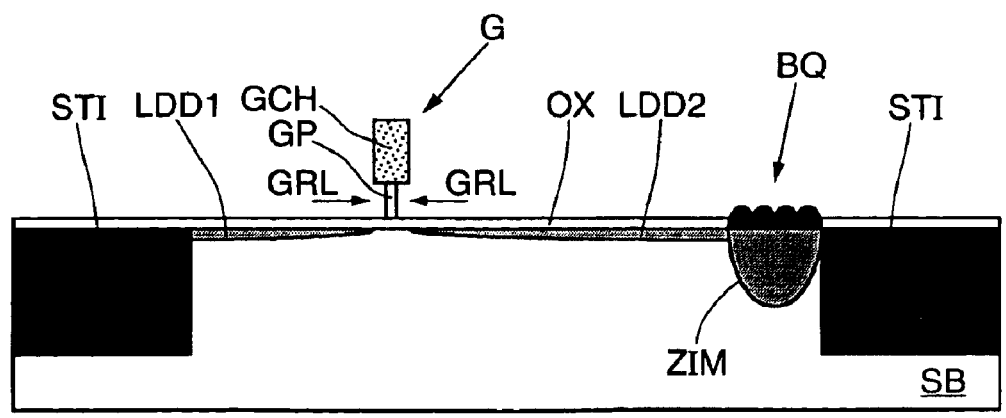
Figure 7G:
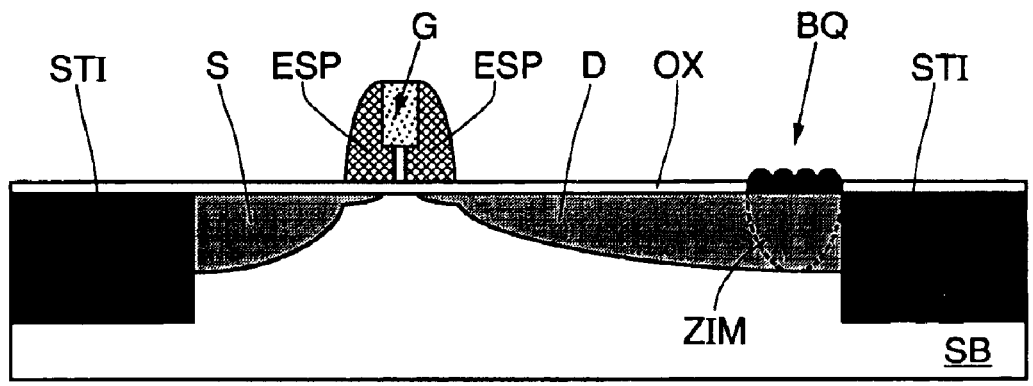
Figure 7H:
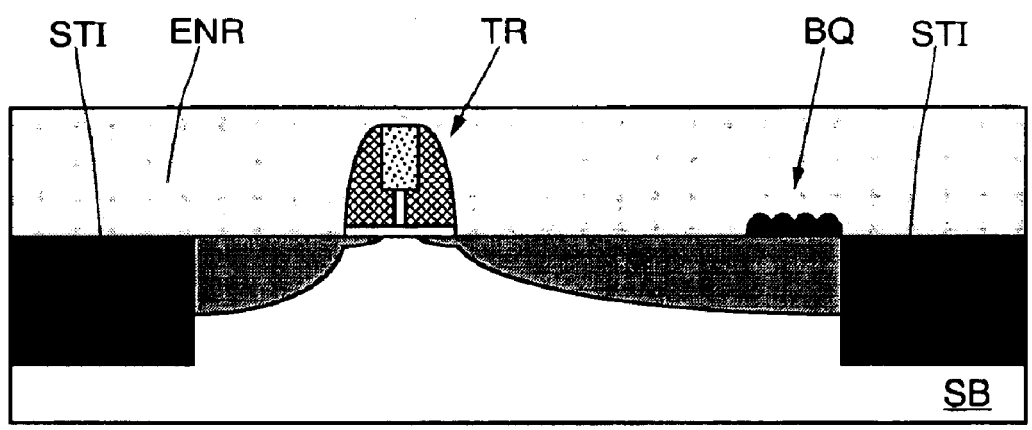

The main steps will now be described with particular reference to FIGS. 7e to 7g. More precisely, the first step is to deposit a stack of a lower layer, for example from a polycrystalline alloy of silicon and germanium, such as $Si_{0.75}Ge_{0.25}$, for example with a thickness of 500 Å. An upper layer of polysilicon is formed above the lower layer, for example 1000 Å thick. The next step is conventional etching of the gate, so as to obtain a gate body CRG, for example, with a length L equal to 80 nm.

The next step is side etching GRL of the lower layer CH2 until a gate bottom GP is obtained, for example with a length equal to 16 nm. The unetched upper layer CH2 then becomes the gate cap GCH (FIG. 7f). The etching GRL can be done using a chemical solution that is selective with respect to silicon, such as a solution of 40 ml of 70% $HNO_3$, 20 ml of $H_2O_2$ and 5 ml HF 0.5%. Side etching could also be done by isotropic plasma that is selective with respect to the silicon and the oxide.

Implantation of source and drain extension areas LDD1 and LDD2 are performed. The isolating side regions (spacers) are formed in contact with the sides of the gate. This is done in a conventional manner as would be readily known by one skilled in the art. For example, the spacers ESP may be made from silicon nitride (FIG. 7g).

A second implantation is performed to form the source and drain regions. The drain region comes into contact with the implanted area ZIM located under the quantum boxes BQ. The next step is to deposit a layer of an isolating medium ENR, for example, a TEOS oxide, on the structure obtained in FIG. 7g.

Figure 7I:
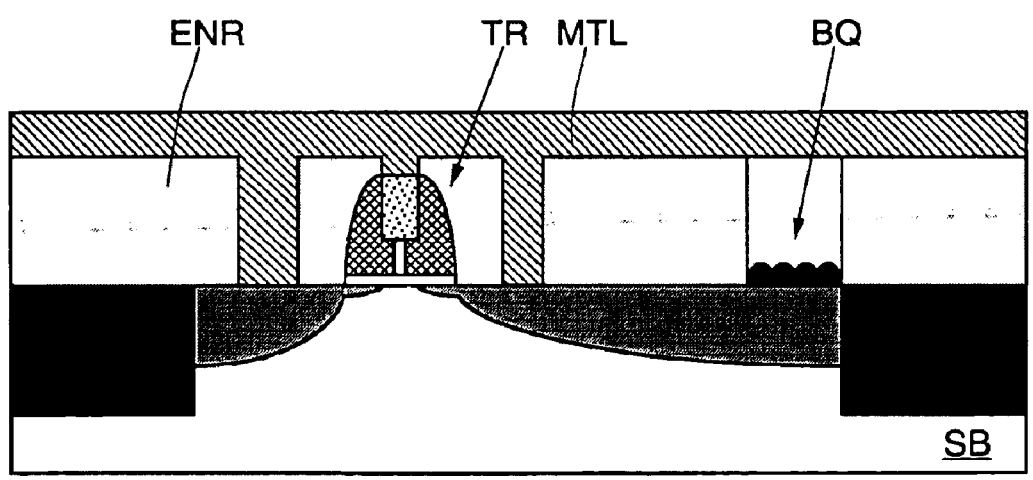

Orifices are then etched in the isolating medium ENR filled with metal MTL (FIG. 7i). The next step in which the device illustrated in FIG. 2 is made, comprises particularly a photolithography step to define the location of the orifice opening above the quantum boxes, followed by etching of the metallic layer and opening of the orifice above the quantum boxes. This orifice is used as a waveguide. It may also be filled with silicon.

The chip containing the device thus made may then be incorporated in a refrigerated containment. The assembly may then form a cryptography device capable of emitting a photon stream, photon after photon.

That which is claimed is:

1. An integrated circuit comprising:
   a semiconductor substrate; and
   a semiconductor device on said semiconductor substrate and forming a single photon source, said semiconductor device comprising:
   a MOS transistor comprising a source, a drain, and a mushroom shaped gate for outputting a single electron to the drain in response to a control voltage being applied to the mushroom shaped gate, and
   at least one quantum box electrically coupled to the drain for outputting a single photon based on reception of the single electron by the drain.

2. An integrated circuit according to claim 1, wherein the mushroom shaped gate comprises a gate bottom with a length L and a width W, and a cap above the gate bottom; said MOS transistor further comprising side insulation regions adjacent to the sides of the mushroom shaped gate; and wherein the source and drain are adjacent to the sides of the gate bottom.

3. An integrated circuit according to claim 2, wherein said MOS transistor further comprises a channel defined between the source and drain; and wherein L and W are chosen so that thermal energy of electrons in the source is less than an electrostatic energy of an electron penetrating into the channel.

4. An integrated circuit according to claim 3, wherein an operating temperature of said semiconductor device is less than 77° K, and L is less than 50 nm.

5. An integrated circuit according to claim 3, wherein W is less than 500 nm.

6. An integrated circuit according to claim 3, wherein said semiconductor device further comprises control means for outputting the control voltage, the control voltage having a first value so that said MOS transistor will not be conducting, and a second value that allows a quantum well to be created in the channel so that the single electron passes from the source to the channel and then to the drain.

7. An integrated circuit according to claim 6, wherein L is greater than or equal to 10 nanometers and less than 50 nanometers; and wherein a product of the second value of the control voltage and a charge of an electron is an integer multiple of the electrostatic energy of the electron penetrating into the channel.

8. An integrated circuit according to claim 7, wherein the product of the second value and the charge of the electron is equal to the electrostatic energy of the electron penetrating into the channel.

9. An integrated circuit according to claim 6, wherein said control means outputs the first and second values of the control voltage at an operating frequency greater than an output frequency of an electron from the channel.

10. An integrated circuit according to claim 9, wherein the operating frequency is between 1 MHz and 1 GHz.

11. An integrated circuit according to claim 3, wherein L is less than 10 nanometers, and the second value of the control voltage corresponds to an alignment of a fundamental level of energy of said semiconductor device with a Fermi level of the source.

12. An integrated circuit according to claim 1, wherein a voltage applied to the drain is less than 10 mV so that the mushroom shaped gate will output the single electron thereto.

13. An integrated circuit according to claim 1, wherein said at least one quantum box comprises a plurality of quantum boxes.

14. An integrated circuit according to claim 1, further comprising an implanted region in said semiconductor substrate under said at least one quantum box, said implanted region having a same type of conductivity as the drain and in contact therewith.

15. An integrated circuit according to claim 1, wherein said at least one quantum box comprises germanium encapsulated in silicon.

16. An integrated circuit according to claim 1, wherein said semiconductor device further comprises a layer of insulating material thereon and surrounding said MOS transistor, said layer of insulating material including an opening above said at least one quantum box for forming an optical wave guide.

17. An integrated circuit according to claim 1, wherein said semiconductor device is operated within a refrigerated environment.

18. A cryptography device comprising:
a single photon source comprising
a semiconductor substrate, and
a semiconductor device on said semiconductor substrate and comprising
a control circuit for outputting a control voltage,
a MOS transistor comprising a source, a drain, a channel defined between the source and drain, and a mushroom shaped gate for outputting a single electron to the drain in response to the control voltage being applied to the mushroom shaped gate, and
at least one quantum box electrically coupled to the drain for outputting a single photon based on reception of the single electron by the drain,
the control voltage having a first value so that said MOS transistor will not be conducting, and a second value that allows the single electron to pass from the source to the channel and then to the drain.

19. A cryptography device according to claim 18, wherein the mushroom shaped gate comprises a gate bottom with a length L and a width W, and a cap above the gate bottom; said MOS transistor further comprising side insulation regions adjacent to the sides of the mushroom shaped gate; and wherein the source and drain are adjacent to the sides of the gate bottom.

20. A cryptography device according to claim 19, wherein L and W are chosen so that thermal energy of electrons in the source is less than an electrostatic energy of an electron penetrating into the channel.

21. A cryptography device according to claim 20, wherein L is greater than or equal to 10 nanometers and less than 50 nanometers; and wherein a product of the second value of the control voltage and a charge of an electron is an integer multiple of the electrostatic energy of the electron penetrating into the channel.

22. A cryptography device according to claim 20, wherein L is less than 10 nanometers, and the second value of the control voltage corresponds to an alignment of a fundamental level of energy of said semiconductor device with a Fermi level of the source.

23. A cryptography device according to claim 18, wherein said control circuit outputs the first and second values of the control voltage at an operating frequency greater than an output frequency of an electron from the channel.

24. A cryptography device according to claim 18, further comprising an implanted region in said semiconductor substrate under said at least one quantum box, said implanted region having a same type of conductivity as the drain and in contact therewith.

25. A cryptography device according to claim 18, wherein said at least one quantum box comprises germanium encapsulated in silicon.

26. A cryptography device according to claim 18, wherein said semiconductor device further comprises a layer of insulating material thereon and surrounding said MOS transistor, said layer of insulating material including an opening above said at least one quantum box for forming an optical wave guide.

27. A process for making a semiconductor device that forms a single photon source, the process comprising:
forming a MOS transistor on a semiconductor substrate, the MOB transistor comprising a source, a drain, and a mushroom shaped gate for outputting a single electron to the drain in response to a control voltage being applied to the mushroom shaped gate; and forming at least one quantum box on the semiconductor substrate that is electrically coupled to the drain for outputting a single photon based on reception of the single electron by the drain.

28. A process according to claim 27, wherein each quantum box comprises germanium encapsulated in silicon.

29. A process according to claim 28, wherein the germanium is selectively grown on a first surface region of the semiconductor substrate, and wherein the silicon is selectively grown on the germanium.

30. A process according to claim 27, wherein forming the at least one quantum box comprises forming a plurality of quantum boxes.

31. A process according to claim 27, further comprising forming a gate oxide layer on the semiconductor substrate; and wherein forming the mushroom shaped gate comprises:

forming a gate body on the gate oxide layer; and etching the gate body to form a gate bottom above which there is a gate cap.

32. A process according to claim 31, wherein the gate body comprises a lower layer and an upper layer thereon; and wherein etching the gate body comprises selectively etching the lower layer with respect to the upper layer.

33. A process according to claim 32, wherein the lower layer comprises silicon and a germanium alloy, and the upper layer comprises silicon.

34. A process according to claim 31, wherein the source and drain are formed while using the gate cap as a hard mask.

35. A process according to claim 27, wherein the mushroom shaped gate is formed so that it comprises a gate bottom with a length L and a width W, and a cap above the gate bottom; and further comprising forming side insulation regions adjacent to the sides of the mushroom shaped gate, with the source and drain being adjacent to the sides of the gate bottom.

36. A process according to claim 35, wherein the MOS transistor further comprises a channel defined between the source and drain; and wherein L and W are chosen so that thermal energy of electrons in the source is less than an electrostatic energy of an electron penetrating into the channel.

37. A process according to claim 27, further comprising forming a control circuit on the semiconductor substrate for outputting the control voltage, the control voltage having a first value so that the MOS transistor will not be conducting, and a second value that allows a quantum well to be created in the channel so that the single electron passes from the source to the channel and then to the drain.

38. A process for emitting a single photon using a semiconductor device comprising a MOS transistor on a semiconductor substrate, the MOS transistor comprising a source, a drain, and a mushroom shaped gate, the semiconductor device also comprising at least one quantum box electrically coupled to the drain, the process comprising:

applying a control voltage to the mushroom shaped gate for outputting a single electron to the drain; and trapping the single electron in the at least one quantum box and causing the single photon to be emitted therefrom.

39. A process according to claim 38, wherein the mushroom shaped gate comprises a gate bottom with a length L and a width W, and a cap above the gate bottom; the MOS transistor further comprising side insulation regions adjacent to the sides of the mushroom shaped gate; and wherein the source and drain are adjacent to the sides of the gate bottom.

40. A process according to claim 39, wherein the MOS transistor further comprises a channel defined between the source and drain; and wherein L and W are chosen so that thermal energy of electrons in the source is less than an electrostatic energy of an electron penetrating into the channel.

41. A process according to claim 40, wherein an operating temperature of the semiconductor device is less than 77° K, and L is less than 50 nm and W is less than 500 nm.

42. A process according to claim 40, wherein the semiconductor device further comprises a control circuit for outputting the control voltage, the control voltage having a first value so that the MOS transistor will not be conducting, and a second value that allows a quantum well to be created in the channel so that the single electron passes from the source to the channel and then to the drain.

43. A process according to claim 42, wherein the control circuit outputs the first and second values of the control voltage at an operating frequency greater than an output frequency of an electron from the channel.

44. A process according to claim 38, wherein a voltage applied to the drain is less than 10 mV so that the mushroom shaped gate will output the single electron thereto.

45. A process according to claim 38, wherein the at least one quantum box comprises germanium encapsulated in silicon.

46. A process according to claim 38, wherein the semiconductor device further comprises a layer of insulating material thereon and surrounding the MOS transistor, the layer of insulating material including an opening above the at least one quantum box for forming an optical wave guide.

* * * * *

UNITED STATES PATENT AND TRADEMARK OFFICE
CERTIFICATE OF CORRECTION

PATENT NO. : 6,852,993 B2
DATED : February 8, 2005
INVENTOR(S) : Monfray et al.

It is certified that error appears in the above-identified patent and that said Letters Patent is hereby corrected as shown below:

Title page,
Item [56], References Cited, insert:
-- FOREIGN PATENT DOCUMENTS
WO  01/93384  12/2001 --.

Column 10,
Line 64, delete "MOB" insert -- MOS --.

Signed and Sealed this

Twenty-third Day of August, 2005

JON W. DUDAS
*Director of the United States Patent and Trademark Office*